United States Patent [19]

Shiga

[11] Patent Number: 5,032,885
[45] Date of Patent: Jul. 16, 1991

[54] SEMICONDUCTOR DEVICE INCLUDING A LIGHT RECEIVING ELEMENT, AN AMPLIFIER, AND AN EQUALIZER HAVING A CAPACITOR WITH THE SAME LAMINATE STRUCTURE AS THE LIGHT RECEIVING ELEMENT

[75] Inventor: Nobuo Shiga, Yokohama, Japan

[73] Assignee: Sumitomo Electric Industries, Ltd., Japan

[21] Appl. No.: 447,059

[22] Filed: Dec. 7, 1989

[30] Foreign Application Priority Data

Dec. 17, 1988 [JP] Japan .................. 63-319256

[51] Int. Cl.$^5$ ................ H01L 27/14; H01L 31/00
[52] U.S. Cl. .................. 357/30; 357/19; 357/22; 357/51; 357/40
[58] Field of Search ............... 357/30 D, 30 G, 30 H, 357/30 I, 30 J, 30 P, 22 I, 30 PF, 19, 51, 56, 40; 372/50

[56] References Cited

U.S. PATENT DOCUMENTS

| 4,701,646 | 10/1987 | Richardson | 357/22 I |
| 4,719,498 | 1/1988 | Wada et al. | 357/30 G |
| 4,924,285 | 5/1990 | Anderson et al. | 357/30 G |
| 4,982,256 | 1/1991 | Suzuki | 357/30 G |

FOREIGN PATENT DOCUMENTS

| EP-0073889 | 3/1983 | European Pat. Off. | 357/30 G |
| EP258530 | 3/1988 | European Pat. Off. | 357/30 PF |
| DE-3629-684 | 3/1988 | Fed. Rep. of Germany | 11/30 PF |
| 59-27580 | 2/1984 | Japan | 357/30 PF |
| 62-190779 | 8/1987 | Japan | 357/30 PF |
| 63-233563 | 9/1988 | Japan | 357/30 PF |

OTHER PUBLICATIONS

Minemura et al., "High Speed Optical Transmission Technique", NEC Report, vol. 39, No. 12, 1986, pp. 92-99.
Leheny et al., "Integrated InGaAs p-i-n FET Photo-Receiver", Electronics Letters, 5/8/80, vol. 16, No. 10.
Leheny et al., "An Integrated PIN/JFET Photoreceiver for Long Wavelength Optical Systems", IEEE, 12/1981.
G. W. Anderson, et al, "Planar, Linear GaAs Detector-Amplifier Array with an Insulating Layer AlGaAs Spacing Layer Between the Detector and Transistor Layers", IEEE Electron Device Letters, vol. 9, No. 10, Oct. 1988, New York, US, pp. 550-552.
C. S. Harder et al, "5.2-GHz Bandwidth Monolithic GaAs Optoelectronic Receiver", IEE Electron Device Letters, vol. 9, No. 4, Apr. 1988, New York, US, pp. 171-173.
H. Nobuhara et al, "Monolithic pinHEMT Receiver for Long Wavelength Optical Communications", Electronic Letters, vol. 24, No. 19, Sep. 15, 1988, Engage GB, pp. 1246-1248.
Patent Abstracts of Japan, vol. 11, No. 265 (E-535) (2712), Aug. 27, 1987, JP-A-62 69672 (Toshiba Corp), Mar. 30, 1987.
European Search Report.

*Primary Examiner*—Rolf Hille
*Assistant Examiner*—Minhloan Tran
*Attorney, Agent, or Firm*—Beveridge, DeGrandi & Weilacher

[57] ABSTRACT

In a high impedance type light receiver circuit comprising a light receiving device, an amplifier circuit for amplifying an output of the light receiving device and an equalizer for band compensation, a capacitor of the equalizer is formed by the same PN junction structure as that of the light receiving device, and the light receiving device, the amplifier circuit and the equalizer are integrated on one semiconductor substrate so that adjustment of the time constant of the equalizer is not necessary. In this manner, the productivity of a high impedance type light receiver circuit which can attain a higher sensitivity than a trans-impedance type circuit, is improved.

8 Claims, 3 Drawing Sheets

SEMICONDUCTOR DEVICE INCLUDING A LIGHT RECEIVING ELEMENT, AN AMPLIFIER, AND AN EQUALIZER HAVING A CAPACITOR WITH THE SAME LAMINATE STRUCTURE AS THE LIGHT RECEIVING ELEMENT

BACKGROUND OF THE INVENTION

1. Field of the Invention

The present invention relates to a semiconductor device, and more particularly to a semiconductor device used as a receiver circuit in a high speed light communication system.

2. Related Background Art

Typical receiver circuits of this type include trans-impedance type and high impedance type (NEC Technical Report, Vol. 39, No. 12, (1986) p. 94). The former has an advantage in that the dynamic range is wide when feedback is applied to an amplifying element. In the latter, a resistance R of a load resistor of a photo-sensing device is increased to reduce thermal noise generated by the load resistor, in order to increase sensitivity. In the past, the former trans-impedance type has been exclusively used and the latter high impedance type has been little used because for the trans-impedance type, it is easy to implement circuit by an integrated while the high impedance type is not suitable for implementation by an integrated circuit.

In the high impedance type receiver circuit, an equalizer for band compensation is required in a rear stage of the circuit because the band is limited by a cut-off frequency which is determined by a time constant ($C \cdot R_L$) where C is a capacitance of an input circuit including a junction capacitance of a photo-sensing device having a PN junction structure and an input capacitance of an amplifier circuit. The equalizer is constructed by connecting a capacitor and a resistor, in parallel and a time constant ($C_{eq} \cdot R_{eq}$) must be equal to the time constant ($C \cdot R_L$), where $C_{eq}$ and $R_{eq}$ are the capacitance and resistance of the equalizer, in order to completely equalize a waveform distorted by band limitation by the photo-sensing device.

The junction capacitance of the photo-sensing device varies from type to type and there is variation even in the same type. As a result, the equalizer cannot be integrated in the same IC chip as that of the amplifier circuit but it should be off the chip and separately adjusted in accordance with the junction capacitance of the photo-sensing device which is separately combined. As a result, the number of parts and the number of production steps increase, which causes the reduction of productivity.

SUMMARY OF THE INVENTION

In the present invention, the capacitor of the equalizer is formed by a PN junction structure similar to the light receiving device, and the amplifier and the equalizer, and the light receiving device are monolithically integrated in one semiconductor substrate to form an opto-electronic integrated circuit (OPIC).

Since the light receiving device and the capacitor of the equalizer are formed on the same semiconductor substrate with similar PN junction structures, they have substantially the same variation characteristic and are affected by an external disturbance in the same direction. Accordingly, by a proper design, ($C \cdot R_L = C_{eq} \cdot R_{eq}$) can be maintained without any individual adjustment.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
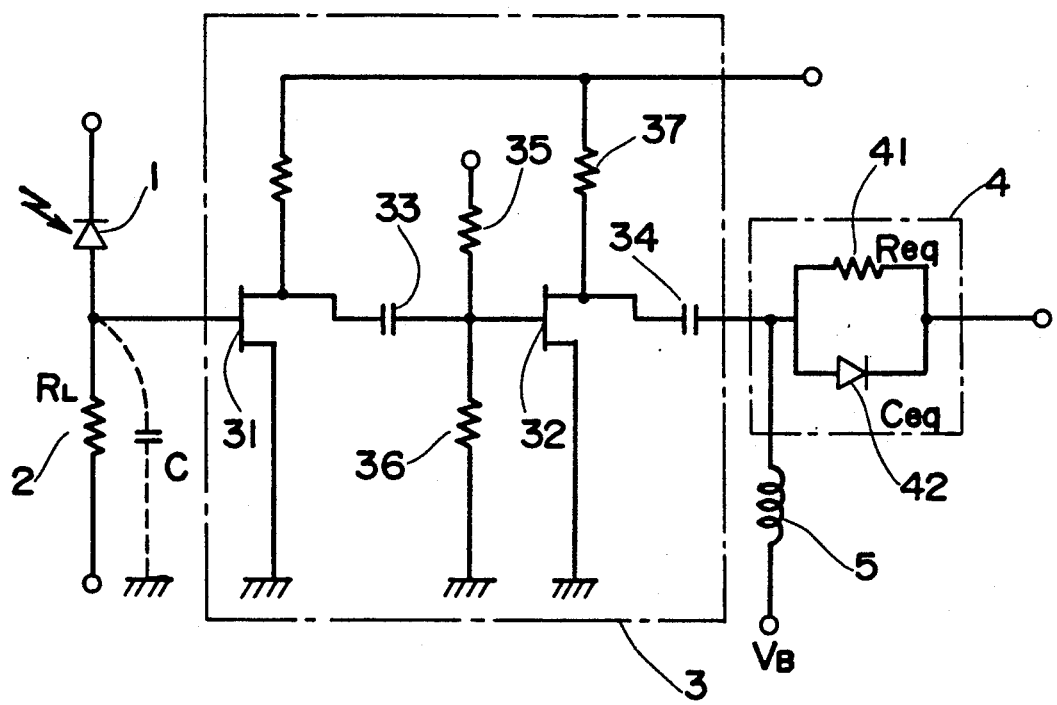
FIG. 1 is a circuit diagram of a light receiver circuit in accordance with one embodiment of the present invention.

The present embodiment relates to a high impedance type light receiver circuit which comprises a light receiving device 1 such as a PIN photo-diode for converting a light input signal to an electrical signal, a load resistor 2, and amplifier circuit 3 for amplifying the output of the light receiving device 1 and a band compensation equalizer 4 connected to a rear stage of the amplifier circuit 3. The equalizer 4 comprises a resistor 41 and a capacitor 42. The PIN photo-diode which is the light receiving device 1 has a PIN junction structure. In the present specification, the PIN junction structure is included in a PN junction structure in its broad sense. Although the amplifier 3 has two stages in FIG. 1, it is not restrictive and any number of stages may be used as required. In the amplifier circuit 3, high electron mobility transistors (HEMT) 31 and 32 are provided. The HEMT is a kind of FET and it is suitable for use in the amplifier circuit in a microwave band because it permits high speed operation, as represented by its name. DC blocking capacitors 33 and 34, resistors 35 to 37 and a pad 50 for external electrical connection are provided.

Figure 2:
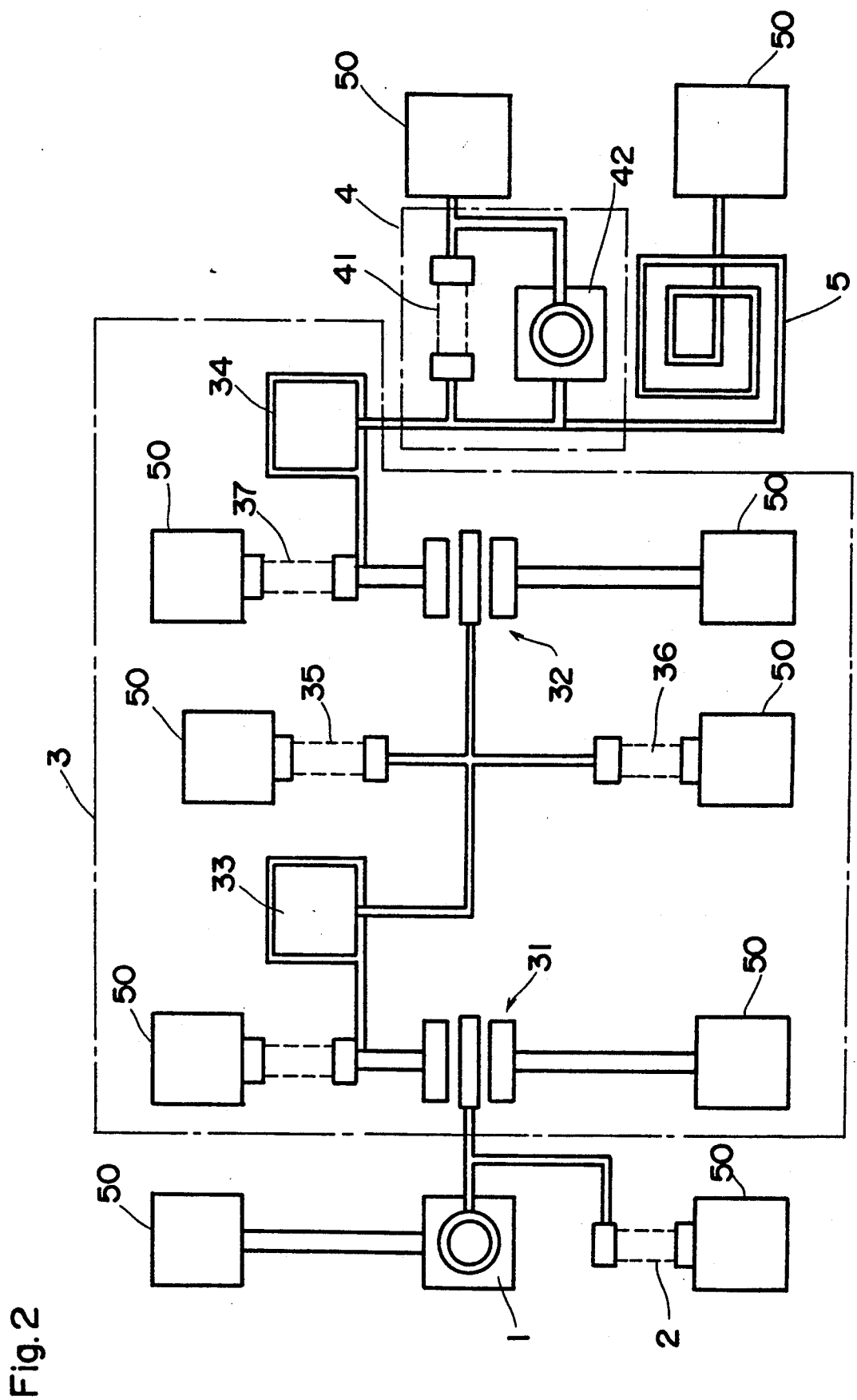
FIG. 2 is a plain view of the light receiver circuit when formed on one semiconductor substrate.

The light receiving device 1 and the electronic circuit comprising the amplifier circuit 3 and the equalizer 4 are monolithically integrated on one semiconductor substrate as shown in FIG. 2 to form a so-called OEIC. A PN junction structure which is substantially identical to the PIN photo-diode which serves as the light receiving device 1 is used as the capacitor 42 of the equalizer 4. A reverse bias voltage which is substantially equal to that for the photo-diode of the light receiving device 1 is applied to the capacitor 42 though the inductor 5 having an impedance which is sufficiently large relative to a signal frequency. Accordingly, the PN junction structure can function as a photo-diode which is similar to the light receiving device 1. In order to make it function as a capacitor, an area of the light receiving plane is covered with a light shielding film so that light is not applied thereto. The light shielding film may be formed by using a metal in the process of electrode formation, without increasing the number of steps.

Figure 3:
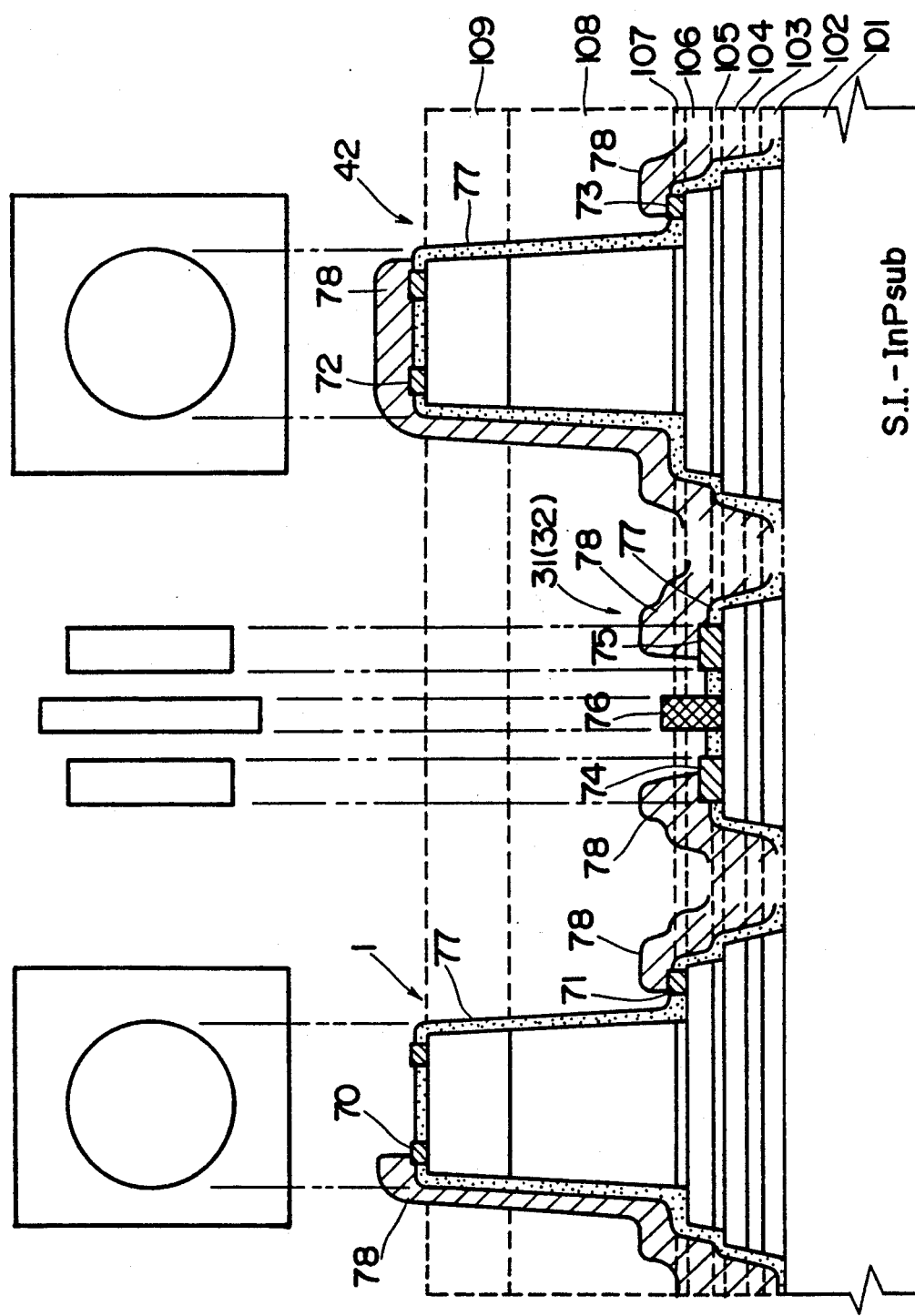
FIG. 3 is a sectional view of the internal structure of a photo-sensing device, a transistor (HEMT) and an equalizer capacitor of the light receiver circuit.

FIG. 3 shows a sectional view of the light receiving device 1, the HEMT 31 (or 32) and the capacitor 42. A manufacturing process for these devices is now explained.

A semi-insulative InP substrate 101 is prepared. Then, epitaxial layers 102 to 109 are sequentially formed on the InP substrate 101 by an organic metal vapor growth method (MOVPE).

The epitaxial layers 102 to 104 are particularly necessary for the formation of the HEMT 31 (or 32), and the epitaxial layers 104 to 109 are particularly necessary for the formation of the light receiving device 1 and the capacitor 42.

The epitaxial layer 102 functions as a buffer layer for preventing impurities in the InP substrate 101 from diffusing into the epitaxial layer formed thereabove. The epitaxial layer 103 functions as an electron conductive layer in the HEMT 31 (or 32) and it is an i-GaInAs layer. The epitaxial layer 104 functions to supply electrons to the active layer 103 in the HEMT 31 (or 32). The material of the epitaxial layer 104 is smaller in electron affinity than that of the electron conductive layer 103, and the PIN structure is formed by those epitaxial layers. The epitaxial layer 106 is an n-GaInAs layer which forms the N-layer of the PIN structure, the epitaxial layer 108 is an i-GaInAs layer which forms the I-layer of the PIN structure, and the epitaxial layer 109 is a P-GaInAs layer which forms the P-layer of the PIN structure.

After those epitaxial layers 102 to 109 have been formed, unnecessary areas of the epitaxial layers 102 to 109 are removed by a conventional photolithography technique and etching technique while leaving only those portions which are required for the light receiving device 1, the HEMT 31 and 32 and the capacitor 42, as shown in FIG. 3. The areas are left such that the internal structures of the light receiving device 1 and the capacitor 42 are identical to each other, as seen from FIG. 3. The dimensions of those devices may be different from each other as required, as will be explained later. Anode electrodes 70 and 72 having a light receiving opening at a center thereof are formed on the P-GaInAs layers 109 of the light receiving device 1 and the capacitor 42, and cathode electrodes 71 and 73 are formed on the n-GaInAs layers 106. In the capacitor 42, the light receiving opening in the anode electrode 72 is not necessary but it has the same structure as the anode electrode 70 for purposes of simplicity. In the HEMT 31 and 32, source electrodes 74, drain electrodes 75 and gate electrodes 76 are formed.

Finally, an insulative film 77 is formed on the entire surface excluding the electrodes, and wiring metals 78 having a desired pattern are formed thereon. The wiring metals 78 also serves as the light shielding film in the capacitor 42 and they block the opening of the anode electrode 72 to prevent external light from entering the interior of the device. Where an electrode having no opening is formed instead of the anode electrode 72, that electrode may function as the light shielding film.

The manufacturing process of the light receiving device 1, the HEMT 31 (or 32) and the capacitor 42 has thus been explained.

On the other hand, the resistor 41 which is the other component of the equalizer 4 has the same structure as the load resistor 2 of the light receiving device 1. The resistor 41 and the load resistor 2 are formed by n⁻ layers having Si ion-implanted in the InP substrate 101 under the same condition.

$C_{eq}$ and $R_{eq}$ are set such that $(C \cdot R_L) = (C_{eq} \cdot R_{eq})$ is met, where C is a capacitance of the input circuit including the junction capacitance of the light receiving device 1, the input capacitance of the FET's of the amplifier circuit 2 and various capacitances of the input circuit, $C_{eq}$ is a capacitance of the capacitor 42 of the equalizer 4, $R_L$ is a resistance of the load resistor 2, and $R_{eq}$ is a resistance of the resistor 41. For example, where the dimensions of the resistor 41 and the load resistor 2 are equal so that $R_{ew} = R_L$, the dimension of the capacitor 42 is determined such that $C_{eq} = C$ is met. In this case, since C includes not only the junction capacitance of the light receiving device 1 but also various capacitances of the input circuit, the dimension of the PN junction structure which forms the capacitor 42 is not always equal to the dimension of the light receiving device 1. As an example, the junction capacitance of the light receiving device 1 is 0.5 pF while the input capacitance of the amplifier 34 is 0.1 pF. Most portions of the capacitance C of the input circuit are occupied by the junction capacitance of the light receiving device 1.

Since all of the elements which define C, $C_{eq}$, $R_L$ and $R_{eq}$ are integrated on one semiconductor substrate, they have substantially the same variation characteristic. For example, if the capacitance C deviates from a design center value due to the variation in the manufacturing process of the junction capacitance of the light receiving device 1, the capacitor 42 which is formed on the same substrate with the same structure also exhibits substantially the same deviation. Because of the same structure, they are affected by an external disturbance in the same direction. Accordingly, the relationship of $(C \cdot R_L) = (C_{eq} \cdot R_{eq})$ is essentially maintained without adjustment.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A high impedance type light receiving semiconductor device comprising:

first means having a laminate structure formed by different layers of semiconductor materials provided on a semiconductor substrate, said first means having a light receiving area, and said first means producing an electric signal in response to light received on said light receiving area thereof;

second means for amplifying an electric signal produced by said first means, said second means being formed on said semiconductor substrate and including means for electrically connecting said second means to said first means; and third means arranged as an equalizer for performing band compensation for an electric signal amplified by said second means and including means for electrically connecting said third means to said second means, a resistor element and a capacitor element, said resistor and capacitor elements being connected in parallel with each other, said capacitor element having the same laminate structure as said first means and a shielding means provided on said third means for preventing light from reaching an area of said third means which corresponds to said light receiving area of said first means.

2. A semiconductor device according to claim 1, wherein said shielding means is formed by a wiring metal.

3. A semiconductor device according to claim 1, wherein said first means comprises a PIN photo-diode.

4. A semiconductor device according to claim 1, wherein said semiconductor device includes a load resistor and said resistor element of said third means has the same structure as said load resistor and is formed on the same semiconductor substrate as said semiconductor device.

5. A semiconductor device according to claim 1, wherein said resistor element of said third means and a load resistor of said first means have n-type semiconductor layers.

6. A semiconductor device according to claim 1, wherein said second means, said first means, and said third means are integrated on said semiconductor substrate.

7. A semiconductor device according to claim 1, wherein said second means comprises a high electron mobility transistor.

8. A semiconductor device according to claim 1, wherein said semiconductor substrate is a semi-insulative substrate formed of a compound semiconductor.

* * * * *